(12) United States Patent
Barnard

(10) Patent No.: US 9,478,388 B2
(45) Date of Patent: Oct. 25, 2016

(54) SWITCHABLE GAS CLUSTER AND ATOMIC ION GUN, AND METHOD OF SURFACE PROCESSING USING THE GUN

(75) Inventor: Bryan Barnard, East Grinstead (GB)

(73) Assignee: VG SYSTEMS LIMITED, Cambridge (GB)

( * ) Notice: Subject to any disclaimer, the term of this patent is extended or adjusted under 35 U.S.C. 154(b) by 507 days.

(21) Appl. No.: 13/823,499

(22) PCT Filed: Oct. 10, 2011

(86) PCT No.: PCT/EP2011/067626
§ 371 (c)(1),
(2), (4) Date: Mar. 14, 2013

(87) PCT Pub. No.: WO2012/049110
PCT Pub. Date: Apr. 19, 2012

(65) Prior Publication Data
US 2013/0180844 A1    Jul. 18, 2013

(30) Foreign Application Priority Data
Oct. 12, 2010 (GB) .................................. 1017173.4

(51) Int. Cl.
*H01J 37/08* (2006.01)
*H01J 27/02* (2006.01)
(Continued)

(52) U.S. Cl.
CPC .............. *H01J 37/08* (2013.01); *H01J 27/026* (2013.01); *H01J 49/142* (2013.01); *H01J 37/05* (2013.01);
(Continued)

(58) Field of Classification Search
CPC ............... H01J 2237/057; H01J 37/05; H01J 2237/0812; H01J 37/3171; H01J 37/08
See application file for complete search history.

(56) References Cited

U.S. PATENT DOCUMENTS 4,755,344 A * 7/1988 Friedman et al. ............ 376/108
4,831,308 A * 5/1989 Konishi et al. ............ 313/362.1
(Continued)

FOREIGN PATENT DOCUMENTS

JP           08122283           5/1996
WO     2006127327 A2     11/2006

OTHER PUBLICATIONS

Datasheet—Ion gun from Ionoptika:http://www.ionoptika.com/products/ion-beams/gas-cluster-ion-beams/81- products/ion-beams/gas-cluster-ion-beams/92-gcib-10.html, downloaded Jul. 10, 2013, 3 pages.
(Continued)

*Primary Examiner* — Keith Hendricks
*Assistant Examiner* — Timon Wanga
(74) *Attorney, Agent, or Firm* — William R. McCarthy, III

(57) ABSTRACT

A method of processing one or more surfaces is provided, comprising: providing a switchable ion gun which is switchable between a cluster mode setting for producing an ion beam substantially comprising ionized gas clusters for irradiating a surface and an atomic mode setting for producing an ion beam substantially comprising ionized gas atoms for irradiating a surface; and selectively operating the ion gun in the cluster mode by mass selecting ionized gas clusters using a variable mass selector thereby irradiating a surface substantially with ionized gas clusters or the atomic mode by mass selecting ionized gas atoms using a variable mass selector thereby irradiating a surface substantially with ionized gas atoms. Also provided is a switchable ion gun comprising: a gas expansion nozzle for producing gas clusters; an ionization chamber for ionizing the gas clusters and gas atoms; and a variable (preferably a magnetic sector) mass selector for mass selecting the ionized gas clusters and ionized gas atoms to produce an ion beam variable between substantially comprising ionized gas clusters and substantially comprising ionized gas atoms. Preferably, the gun comprises an electrically floating flight tube for adjusting the energy of the ions while within the mass selector.

18 Claims, 10 Drawing Sheets

(51) Int. Cl.
*H01J 49/14* (2006.01)
*H01J 37/05* (2006.01)
*H01J 37/317* (2006.01)

(52) U.S. Cl.
CPC ....... *H01J 37/3171* (2013.01); *H01J 2237/057* (2013.01); *H01J 2237/0812* (2013.01); *H01J 2237/0827* (2013.01)

(56) References Cited

U.S. PATENT DOCUMENTS

| | | | |
|---|---|---|---|
| 6,222,185 B1* | 4/2001 | Speakman et al. | 250/288 |
| 2001/0033128 A1* | 10/2001 | Torti et al. | 313/359.1 |
| 2005/0082497 A1 | 4/2005 | Goldberg et al. | |
| 2006/0169915 A1 | 8/2006 | Olson et al. | |
| 2007/0170372 A1 | 7/2007 | Horsky | |
| 2008/0105833 A1 | 5/2008 | England et al. | |
| 2010/0155619 A1* | 6/2010 | Koo et al. | 250/424 |

OTHER PUBLICATIONS

Datasheet—Ion gun from Kratos:http://surface.kratos.com/Depth-Profiling/argon-gas-cluster-ion-source/Hardware.html, downloaded Jul. 10, 2013, 5 pages.

Matsuo, J., et al., "Gas cluster ion beam equipments for industrial applications," Nuclear Instruments & Methods in Physics Research, Section B (Beam Interactions with Materials and Atoms), Netherlands, vol. 899, No. 1-4, May 1995, pp. 244-247.

Yamada, I., "Characteristics and peculiarities of surface processing by gas cluster ion beams," Nuclear Instruments & Methods in Physics Research, Section B (Beam Interactions with Materials and Atoms), Elsevier, Amsterdam, NL, vol. 112, No. 1, May 1996, pp. 242-247.

* cited by examiner

SWITCHABLE GAS CLUSTER AND ATOMIC ION GUN, AND METHOD OF SURFACE PROCESSING USING THE GUN

FIELD OF THE INVENTION

The invention relates to the field of ion guns and in particular ion guns which can produce gas cluster ion beams which can be used to etch a surface for surface analysis. The invention also relates to uses of such ion guns and methods of processing surfaces. In preferred embodiments, the invention relates to the use of ion beams for cleaning and/or etching a surface prior to or during analysis of said surface, e.g. by XPS analysis.

BACKGROUND OF THE INVENTION

In surface analysis by techniques such as X-ray photoelectron spectroscopy (XPS), Auger electron spectroscopy (AES) or secondary ion mass spectrometry (SIMS) for example, ion beams produced by an ion gun, particularly argon ion beams, are widely used to bombard the surface to be analysed. Such beams are used, for example, to clean surfaces of contaminants prior to analysis by the aforementioned techniques and/or to etch through surface layers to reveal the underlying structure to enable a depth profiled analysis of the surface to be made. It is difficult to produce argon ion beams with sufficiently low energy to avoid damage to some types of surface during the etching process, especially surfaces of organic materials, and consequent loss of chemical and molecular information about the surface. To avoid the aforementioned damage it is known that it requires the use of ion beams having particles with very low energy, typically less than 10 eV. This is not possible using a simple argon ion beam where such low energy beams are difficult to create and to focus due to space charge effects. Herein the term argon ion beam refers to a beam of ionised single argon atoms, ($Ar^+$).

Improvements have been made by using $C_{60}$, or other fullerene, ion beams, initially for SIMS and more recently for XPS analysis. Apparatus and methods using $C_{60}$ ion beams are disclosed in GB 2386747 A and US 2008/0042057 A1. Other ion beams employing large molecules, such as coronene ion beams as well as ion beams using other polycyclic aromatic hydrocarbon (PAH) molecules, have also been employed as described in GB2460855 A. Such large molecules are generated with a high energy of typically 10 keV or more, but on impact fragment into smaller clusters and atoms which individually have very low energy. However, for at least XPS analysis, the use of a carbon based ion beam leads to surface deposition of carbon which can both halt the etching process and modify the chemistry of the sample thereby leading to erroneous results. Ion beams employing metal clusters have also been tried but large clusters are difficult to form.

An alternative approach has been the use of ion beams produced by ionising and accelerating argon clusters which are generated by supersonic expansion of argon gas through a nozzle. In this way, clusters of a few hundred argon atoms to a few tens of thousands of argon atoms can readily be formed. This has been widely used in SIMS and has been proposed for XPS in JP 08-122283 A, JP 2008-116363 A and WO 2009/131022. However, this technique has not been exploited commercially for application in XPS, which is believed to be due to the engineering difficulties of producing a focused beam with argon clusters of the correct size to produce a useful etch rate without destroying the sample chemistry.

Inert gas cluster sources in general have been widely used since the 1970's (see Hagena and Obert, Cluster Formation in Expanding Supersonic Jets: Effect of Pressure, Temperature, Nozzle Size and Test Gas, The Journal of Chemical Physics Vol 56 No 5 March 1972 p 1793). Commercially they are employed for the polishing of wafers. However, the focus of such commercial developments has been on the generation of high current ion beams (e.g. several microamps) using relatively large expansion nozzle sources typically bigger than 150 microns. This necessitates the use of large high speed vacuum pumps. Large inert gas clusters of several thousand atoms are typically preferred in these wafer polishing applications. Such gas cluster sources are not generally suitable for use with smaller vacuum systems as used with surface analysis systems such as XPS systems.

In view of the above, the present invention has been made.

SUMMARY OF INVENTION

According to an aspect of the present invention there is provided a method of processing one or more surfaces, the method of processing comprising:

providing a switchable ion gun which is switchable between a cluster mode setting for producing an ion beam substantially comprising ionised gas clusters for irradiating a surface and an atomic mode setting for producing an ion beam substantially comprising ionised gas atoms for irradiating a surface; and selectively operating the ion gun in the cluster mode thereby irradiating a surface substantially with ionised gas clusters or the atomic mode thereby irradiating a surface substantially with ionised gas atoms.

The method also may comprise switching the ion gun to the other mode followed by operating the ion gun in the other mode. In that way, the gun may be operated to irradiate a surface substantially with ionised gas clusters when in cluster mode and to irradiate a surface substantially with ionised gas atoms when in atomic mode. The processing of the one or more surfaces according to the present invention is preferably for analysis of the one or more surfaces by one or more surface analysis methods. Typically, the processing may comprise a surface cleaning process or a surface etching process, e.g. for depth profiling of a surface by one or more surface analysis methods. Details of the surface analysis methods are described below.

According to another aspect of the present invention there is provided a switchable ion gun comprising:

a gas expansion nozzle for producing gas clusters in the presence of gas atoms by expansion of a gas through the nozzle;

an ionisation chamber for ionising the gas clusters and gas atoms;

a variable mass selector for mass selecting the ionised gas clusters and ionised gas atoms to produce an ion beam variable between substantially comprising ionised gas clusters and substantially comprising ionised gas atoms.

Preferably, the ion gun comprises a magnetic variable mass selector, such as a magnetic sector, and an electrically floating ion optical device, which is preferably an electrically floating flight tube, preferably located at least partially within the magnetic variable mass selector, for adjusting the energy of the ions within the magnetic mass selector. These and other preferable features are described in further detail below.

According to yet another aspect of the present invention there is provided a switchable ion gun comprising:

a gas expansion nozzle for producing gas clusters in the presence of gas atoms by expansion of a gas through the nozzle;

an ionisation chamber for ionising the gas clusters and gas atoms;

a variable mass selector for mass selecting the ionised gas clusters and ionised gas atoms to produce an ion beam comprising ionised gas clusters and/or ionised gas atoms of selected mass, wherein the variable mass selector comprises a magnetic variable mass selector and an electrically floating ion optical device for adjusting the energy of the ions whilst within the magnetic mass selector.

The floating ion optical device is for adjusting the energy of the ions compared to the source energy of the ions, e.g. so that within the magnetic mass selector they can have a local energy within the magnetic mass selector which is different, preferably substantially different, to the source energy of the ions. The electrically floating ion optical device is preferably located at least partially within the magnetic variable mass selector.

According to still another aspect of the invention there is provided use of a switchable ion gun having selectable cluster mode and atomic mode settings to irradiate a surface with an ion beam, wherein use in the cluster mode produces an ion beam substantially comprising ionised gas clusters; and use in the atomic mode an ion beam substantially comprising ionised gas atoms.

According to further aspects of the invention, there is provided a switchable ion gun, which is switchable between a cluster mode for producing an ion beam substantially comprising ionised gas clusters for irradiating a surface and an atomic mode for producing an ion beam substantially comprising ionised gas atoms for irradiating a surface, wherein the ion gun has one or more of the following:

i.) a magnetic variable mass selector to select the mass of the ions in the ion beam; and an electrically floating ion optical device for adjusting the energy of the ions whilst within the magnetic mass selector;
ii.) a metal expansion nozzle;
iii.) a microfabricated metal expansion nozzle;
iv.) an metal expansion nozzle wherein an aperture is not more than 100 microns in diameter.

According to additional aspects of the invention, there is provided a method of processing one or more surfaces, the method of processing comprising:

providing a switchable ion gun which is switchable between a cluster mode of the switchable ion gun for producing an ion beam substantially comprising ionised gas clusters for irradiating a surface and an atomic mode of the switchable ion gun for producing an ion beam substantially comprising ionised gas atoms for irradiating a surface; and using the ion gun to irradiate the one or more surfaces in the cluster mode and/or atomic mode;

the method having one or more of the following:
i.) a magnetic variable mass selector to select the mass of the ions in the ion beam; and an electrically floating ion optical device for adjusting the energy of the ions whilst within the magnetic mass selector;
ii.) a metal expansion nozzle;
iii.) a microfabricated metal expansion nozzle;
iv.) an metal expansion nozzle wherein an aperture is not more than 100 microns in diameter.
v.) the gas is argon;
vi.) in cluster mode the clusters in the ion beam have a lower size limit in the range 50 to 2000 atoms;
vii.) in cluster mode the clusters in the ion beam have an energy per atom in the range 1 to 50 eV, more preferably 1 to 10 eV;
viii.) the source energy of the ions is 5 keV or less.

In even further aspects, the present invention provides an ion gun for producing an ion beam comprising ionised gas clusters for irradiating a surface, wherein the ion gun has one or more of the following:

i.) a magnetic variable mass selector to select the mass of the ions in the ion beam; and an electrically floating ion optical device for adjusting the energy of the ions whilst within the magnetic mass selector;
ii.) a magnetic variable mass selector which comprises a magnetic sector to select the mass of the ions in the ion beam; and an electrically floating flight tube for adjusting the energy of the ions whilst within the magnetic sector;
iii.) a metal gas expansion nozzle for forming ionised gas clusters;
iv.) a microfabricated metal expansion nozzle for forming ionised gas clusters;
v.) an metal expansion nozzle for forming ionised gas clusters wherein an aperture is not more than 100 microns in diameter.
vi.) an ionisation chamber for forming the ions with a source energy of 5 keV or less.

In even further aspects still, the present invention provides a method of processing one or more surfaces, the method of processing comprising:

providing an ion gun for producing an ion beam comprising ionised gas clusters for irradiating a surface; and using the ion gun to irradiate the one or more surfaces with ionised clusters;

the method comprising one or more of the following:
i.) selecting the mass of the ions in the ion beam using a magnetic variable mass selector and an electrically floating ion optical device for adjusting the energy of the ions whilst within the magnetic variable mass selector;
ii.) forming the ions through a metal expansion nozzle;
iii.) forming the ions through a microfabricated metal expansion nozzle;
iv.) forming the ions through an expansion nozzle wherein an aperture is not more than 100 microns in diameter.
v.) forming the ions with a source energy of 5 keV or less.

The switchable ion gun is an ion beam source which enables fine control of the ion beam by independent mass and energy selection to select the energy per atom of the ions in the beam to be the most appropriate energy for the sample to be etched.

Beneficially, the ion gun used in the present invention is capable of producing widely different types of processing since it is switchable between producing a beam of ionised gas atoms, which typically are of relatively high energy per atom (e.g. at least 500 eV per atom) and a beam of ionised gas clusters, which typically are of relatively low energy per atom (e.g. not greater than 50 eV per atom). Advantageously, therefore, the invention provides a dual-mode ion gun that can be used to effect widely differing types of surface processing. This avoids the need in the prior art to provide separately in one or different analysis chambers both an ion gun for producing high energy ionised gas atoms for high energy cleaning and/or etching and ion gun for producing ionised gas clusters for low energy cleaning and/or etching. The present invention thus reduces cost of analysis equipment by only requiring one ion gun, and by only requiring one power supply. Also, the invention also provides the ability to fit the capability for both atomic and cluster ion beams in the limited space typically available on a surface analysis system.

The ionised gas atoms have a higher energy per atom than the ionised gas clusters since the energy in the cluster is divided between many atoms. The irradiating a surface with ionised gas atoms may be suitable for more aggressive cleaning and or faster etching than the irradiating with ionised gas clusters and may be used on harder surfaces, such as various types of inorganic surface, e.g. metallic or metal oxide surfaces. The ionised gas clusters may be suitable for softer surfaces and/or surfaces prone to chemical damage from high energy irradiation, e.g. organic surfaces. Organic surfaces which may be treated may include, without limit, polymers, biomaterials and the like. The invention thus also provides an ability to undertake a depth profile through a multilevel structure of both soft and hard materials. The prior art methods in contrast would require two ion guns, one source for a high energy atomic beam for the hard layers and a separate source for a low energy cluster beam for the softer layers. Often it is not feasible from the point of view of cost or space to provide two ion beams sources and consequently, accurate analysis of such multilevel structures of both soft and hard materials was not possible in the prior art.

Incorporating the dual mode capability into a single switchable ion gun provides the user with the flexibility to depth profile through all types of material. For example, the switchable ion gun provides a new capability to depth profile through "soft" polymer materials using the gas cluster ion beam and the ability to change over to the atomic ion beam when required to allow profiling through thicker layers of metallic materials.

The present invention also has advantages from the viewpoints of size and cost that an effective and efficient ion source may be provided if smaller clusters are employed and, accordingly, preferred features of the invention relate to the generation and/or selection of gas clusters of a selected small size for the gas cluster ion beam. Use of smaller size clusters for example enables a lower energy to be used in the source for accelerating the ions. For example, whereas a prior art argon cluster ion gun typically has operated with a source energy of 10 or 20 keV, the present invention may be operated with a source energy of 6 keV or below, or 5 keV or below or 4 keV or below, yet still with a high efficiency for etching. Particular features of the invention are directed in this regard to the preferential generation of smaller size clusters compared to the prior art. Employment of advantageous nozzle features are useful in this respect for instance.

The energy per atom of the ionised gas cluster is also of a preferably low energy, e.g. preferably in the range 1 to 50 eV, although 1 to 100 eV may be used. Preferably, the energy per atom of the ionised gas cluster is not greater than 10 eV, e.g. it is in the range 1 to 10 eV. The energy per atom of an ionised gas cluster herein means the energy of a cluster divided by the number of atoms contained in the cluster. The energy per atom of an ionised gas atom is of course simply the energy of that atom.

When operated in the atomic mode for producing a beam substantially comprising ionised atoms for irradiating a surface, the energy per atom is typically in the range 100 eV to 10 keV, e.g. in the range 500 eV to 10 keV. The mere energetic ionised atoms in the atomic ion beam may be used to rapidly etch through less sensitive sample surfaces.

The effect of irradiating a surface with the ionised gas clusters and gas atoms is typically to process the one or more surfaces in order to modify the one or more surfaces. Preferably, the one or more surfaces are processed by the irradiation to remove contamination from and/or etch the one or more surfaces. Removal of contamination (i.e. cleaning) is preferably performed prior to analysis by the surface analysis method. Etching means to remove one or more surface layers and etching is useful for, for example, depth profiling by the surface analysis method. Etching may be performed during the surface analysis method.

The surface irradiated with the ionised gas clusters may be the same or a different surface to the surface irradiated with ionised gas atoms. As an example, a first surface which has a thick layer of contamination may be subjected to irradiation with ionised gas atoms in a high energy cleaning process (i.e. ion gun in atomic mode) to remove the contamination, followed by irradiation with ionised gas clusters in a lower energy etching step (i.e. ion gun in cluster mode) whilst a surface analysis method is performed on the first surface. The lower energy etching step using gas clusters may be helpful where a slower, gentler etching is required. Alternatively, as another example, the first surface may be subjected to irradiation with ionised gas clusters in a lower energy cleaning process to remove the contamination in a very controlled manner so that the contamination but little or no sample is removed, followed by irradiation with ionised gas atoms to effect a rapid or deeper etching of the surface. Alternatively, as another example, the first surface may be processed (e.g. cleaned and/or etched) using only the beam of ionised gas atoms (e.g. where the first surface is of a harder material) and a second surface, different to the first surface, may be processed (e.g. cleaned and/or etched) using the beam of ionised gas clusters (e.g. where the second surface is of a softer material than the first material). Thus, the beams of ionised gas clusters and ionised gas atoms may be used to process the same surface or different surfaces. It is evident that the ion gun is operated at any one time in either of the cluster or atomic mode settings, i.e. in either cluster ion beam or atom ion beam mode. The different ion gun settings are thus not used concurrently.

Use of the beam of ionised gas atoms may be for effecting faster and/or deeper processing, e.g. faster and/or deeper cleaning and/or etching, of the surface. Use of the beam of ionised gas atoms may be for effecting processing, e.g. on harder substrates, e.g. of certain inorganic materials. On the other hand, use of the beam of ionised gas clusters may be for effecting slower and/or shallower processing, e.g. faster and/or deeper cleaning and/or etching, of the surface. Use of the beam of ionised gas clusters may be for effecting processing, e.g. on softer substrates, e.g. of certain organic materials.

The one or more surfaces are located in a reduced pressure, i.e. vacuum, environment, typically inside a vacuum analysis chamber, e.g. a high or ultra high (UHV) vacuum chamber. The ion gun according to the present invention is preferably mounted on the vacuum chamber to direct an ion beam at the surface.

The ion gun is suitable for processing one or more surfaces for analysis by one or more surface analysis methods. The surface analysis methods may any surface analysis methods requiring cleaning of a surface and/or etching of a surface in order to perform the required analysis. The invention is especially useful for analysis methods where depth profiling of the surface is required and the ion beam can be employed to etch the surface while analysis is made of the surface. In that way analysis is conducted in a depth direction thereby to chemical information as a function of depth of the surface (i.e. depth profiling).

Suitable surface analysis methods may be one or more of X-ray photoelectron spectroscopy (XPS), Auger electron spectroscopy (AES), secondary ion mass spectrometry (SIMS), ultraviolet photoelectron spectroscopy (UPS) as well as others known in the art. The invention is especially useful for XPS and more especially useful for XPS where depth profiling of the surface is required and the ion beam can be employed to etch the surface while XPS analysis is made of the surface.

The gas which is employed in the ion gun for forming the gas cluster or atomic gas ion beam is preferably an inert gas, such as helium, neon, argon, krypton or xenon for example. Most preferably, the gas is argon. The gas is preferably not a carbon containing gas, thereby to avoid surface contamination with carbon which is a problem with prior art ion guns using $C_{60}$ for example. Another possible non-carbon containing gas which could be used is oxygen ($O_2$). Other gases could be used.

The ion gun comprises an expansion nozzle forming part of a gas cluster source to produce gas clusters from the gas fed into it. The ion gun further comprises an ionisation chamber or ioniser to ionise the formed gas clusters as well as to ionise individual gas atoms present.

The cluster source produces gas clusters through the nozzle which accompany individual gas atoms, i.e. atoms which have not formed clusters.

The expansion nozzle is a nozzle through which supersonic expansion of the gas may take place so as to form gas clusters. The nozzle accordingly has a gas inlet and a gas outlet. As known in the art, the nozzle produces gas clusters by expansion of a gas through the nozzle from a pressurised region, on the inlet side, of the cluster source into a reduced pressure region, on the outlet side, of the cluster source. The expansion nozzle has an orifice through which the gas is passed to form clusters which is preferably an orifice of diameter 100 microns or less, more preferably 90 microns or less, e.g. 80 or 85 microns. Preferably the orifice is of substantially circular shape. The nozzle may be, for example, a cone shaped nozzle (conical nozzle), a laval nozzle, or a sonic nozzle, preferably a laval nozzle. The nozzle may be fabricated of glass or metal. Preferably the nozzle is made of metal. Preferably the nozzle is microfabricated to produce a very small, uniform-shaped orifice in the nozzle. Such a very small, uniform-shaped orifice in the nozzle improves the ability to reproduce clusters with a relatively small size profile to more efficiently utilise the clusters for surface processing and to utilise the characteristics of the ion optical components and mass selector of the ion gun according to the invention. Such a nozzle is an improvement compared to the conventional glass nozzles, which may suffer from material wastage during manufacture arising from failed attempts to produce an acceptable nozzle, as well as lower uniformity of size and shape from one nozzle to another.

For operation in the cluster mode, the pressure in the pressurised region of the cluster source, i.e. on the inlet side of the nozzle (inlet pressure), is preferably in the range 2 to 20 bar, more preferably 2 to 5 bar but typically about 3 to 4 bar is found to be efficient. For operation in the atomic mode, the inlet pressure may be the same as for operation in the cluster mode and the mass elector then simply selects ionised atoms in the ion beam rather than ionised clusters. However, for operation in the atomic mode, it is preferable to use an inlet pressure which is below that at which clusters form. Preferably, the inlet pressure for atomic mode operation is below 2 bar, typically below 1 bar. The reduced pressure region into which the gas clusters or atoms are first introduced, on the outlet side of the nozzle, is preferably less than 1 mbar (i.e. $1 \times 10^{-3}$ bar).

In the application of the gas cluster ion beam to XPS depth profiling for example, relatively small clusters are preferred (e.g. up to a few hundred atoms, e.g. up to 500 atoms per cluster) and beam currents of a few tens of nA are sufficient for etching most samples. A much smaller nozzle diameter is preferred in the present invention of typically less than 100 microns, which has been found to preferentially form smaller sized clusters than prior art nozzles in gas cluster ion beam sources. In this way, having a higher proportion of smaller gas clusters enables a more effective beam for etching since the beam has a larger number of the smaller sized clusters and less of the larger clusters which are not so effective for etching. The use of such a small size nozzle also has the advantage that the ion gun of the invention does not require large pumps which are not practical on an XPS system and so the pumping complexity and cost is reduced. For the engineering and production of reproducibly sized and shaped nozzles, a micro-manufacturing technique is preferably employed to produce metal nozzles of the required characteristics. The cluster size is therefore also more reproducibly controlled by using nozzles which are reproducibly sized and shaped. A simple cone or conical shaped "sonic" nozzle may be employed, although a parabolic laval nozzle is preferred. In this way, the differential pumping requirements can be simplified and cost reduced and by choosing a suitable operating regime with such a nozzle size the ion gun source can be optimized for the generation of small gas clusters.

A range of cluster sizes are typically produced by the cluster source. The cluster sizes produced by the source may be in the range from 10 to 10,000 atoms or more. Preferably ionised gas clusters are selected by the variable mass selector for output in the ion beam which have a lower cluster size limit (i.e. the lowest size of cluster which is selected and transmitted) preferably of at least 50 atoms, more preferably at least 100 atoms. An example of an effective lower cluster size limit is therefore 200 (i.e. clusters of 200 atoms and greater are selected). The lower cluster size limit is preferably not greater than 2000 atoms, more preferably not greater than 1000 atoms, still more preferably not greater than 500 atoms and most preferably not greater than 400 atoms. Accordingly, ionised gas clusters are selected by the variable mass selector for output in the ion beam which have a lower size limit desirably in the range 50-2000 atoms, and most desirably in the range 50-400. This ensures that smaller sized clusters are selected and the small nozzle size ensures a higher proportion of smaller sized clusters are present. The aforementioned cluster sizes are especially preferred sizes in the case of using the most preferred gas, which is argon.

An ionisation chamber forms ions from the clusters and/or atoms. The ionisation chamber is a typical ioniser as known in the art. Typically the ionisation chamber comprises one or heatable filaments which are negatively electrically biased and an anode such as the chamber itself which positively electrically biased to high voltage (e.g. 2 to 20 keV) in order for electrons to be emitted by the heated filament towards the anode and thereby ionise the clusters and atoms present. The ions (clusters and atoms) produced are thus typically formed at an energy, referred to herein as the source energy, in the range 2 to 20 keV, preferably 2 to 10 keV, but the energy could be higher or lower than this range. The source energy defines the energy of the ions when they impact the surface of the sample where the surface is at ground potential as is typically the case. This is to provide them with appropriate energy per atom for cleaning and/or etching the particular surface to be processed. The source energy is generally enabled to be lower than is used in the prior art. Preferably, the energy of the ions is 6 keV or less, more preferably 5 keV or less and most preferably 4 keV or less, e.g. in the range 2 to 6 keV, 2 to 5 keV or 2 to 4 keV. The use of smaller sized clusters enables a lower energy to be used whilst maintaining a sufficient energy per atom in the ionised gas clusters. This reduced energy reduces cost and size of power supply. The ions preferably are extracted from the ionisation chamber by an extractor lens and focused by a condenser lens, preferably before entry to the variable mass selector.

The source energy of the ions can be selected independently of the selection of the mass (size) of the ions (clusters and atoms) as hereinafter described in more detail. The energy provided to the ions can thereby be selected to a desired value and the mass can be separately, i.e. independently, selected thereby to choose an appropriate size of ionised cluster or atom. A desired energy per atom can thereby be tuned by the mass selector, e.g. to tune the energy per atom of clusters in the ion beam to have a value typically between 1 eV and 50 eV or lower. Preferably, the energy per atom of the ion is just large enough to etch ions from the surface without causing subsurface chemical damage.

Magnetic sectors are widely use for mass selection and, especially when combined with electrostatic fields, such as in a Wein filter, can give good mass resolution. However when working with high masses such as encountered with inert gas clusters like argon clusters, such devices are required to be large, since to achieve mass selection they need to use large electro-magnets. For this reason previous argon cluster ion sources have typically used a permanent magnet to generate a fixed magnetic field of sufficient strength to deflect argon atoms and argon clusters of small size and to select a fixed range of cluster sizes. However, such devices with permanent magnets do not have a well defined mass selection behaviour. Furthermore, in such cases the mass selection is not variable, or at least not variable independently of the energy of the ions input to the magnetic field, since the magnet is permanent.

In the present invention, a mass selector (mass filter) can be used in the ion gun to select ionised clusters and/or atoms of the most appropriate size for the sample to be etched in order to achieve a desired energy per atom of the ion. The mass selector of the ion gun is a variable mass selector, which means that it can vary the mass selected by it independently of the source energy of the ions input to it. The variable mass selector acts as a filter to select ionised gas clusters and/or atoms having a selected mass, which herein means a particular mass or more usually a mass range.

The variable mass selector may select a mass range of the ions allowed to pass through the mass selector such that a beam of ions is selected which substantially comprises ionised gas clusters, as in the cluster mode of the ion gun; or the mass selector may select a mass range of the ions such that a beam of ions is selected which substantially comprises ionised gas atoms, as in the atomic mode of the ion gun. This degree of flexibility is not achieved in the prior art cluster ion guns. In cluster mode, the ion beam substantially comprises ionised clusters. In this way, the absence of any significant amount of ionised atoms reduces any damage which ionised atoms may cause. The ionised atom content of the ion beam in cluster mode may be less than 1% of all ionised particles after the beam has passed through the mass selector. In the atomic ion mode, the ion beam substantially comprises ionised atoms. The presence of some ionised clusters in the atomic ion beam is not a problem. The selection of the cluster or atomic ions in the preferred mass selector comprising a magnetic field eliminates any uncharged clusters or atoms that might otherwise cause non-uniform profiling. The content of neutral atoms and clusters may be less than 1% of the ion beam.

The variable mass selector is preferably located in the ion gun downstream, in the ion flight direction, of the cluster source and ionisation chamber. The variable mass selector is further preferably located downstream of at least one ion extractor lens and at least one condenser lens. The variable mass selector is preferably located outside of the vacuum chamber (e.g. UHV chamber) in which the surface to be irradiated is located.

The variable mass selector is preferably operable as a high pass mass selector (i.e. selects masses at or higher than a given lower mass limit) or may be operable as a band pass mass selector (i.e. selects masses within a given mass band or range having upper and lower mass limits).

In the present invention, it is preferred to use as the variable mass selector a magnetic mass selector, more preferably a magnetic sector, especially a short magnetic sector. The magnetic sector is preferably operable as a high pass mass selector (i.e. selects masses at or higher than a given lower mass limit) and/or may be operable as a band pass mass selector (i.e. selects masses within a given mass band or range having upper and lower mass limits).

Preferably, the magnetic sector is of a length (i.e. length in the direction of ion flight) which does not increase the ion flight path within the ion gun by a significant amount, e.g. the length of the magnetic sector is preferably not more than about half, still more preferably not more than about a third, of the ion path length from the source (nozzle inlet) to the sample. In one embodiment for example, the ion path from the source to the sample is about 600 mm of which only 200 mm is the length of the magnetic sector. A shorter magnetic sector is advantageous because gas clusters are constantly falling apart and a shorter path length increase the probability of intact clusters reaching the sample surface. In the present invention, a short magnetic sector length is possible because of the lower mass regime for the clusters (i.e. relatively small clusters are produced and mass selected) and the use of a floating flight tube.

The magnetic sector preferably comprises an electromagnet, more preferably a programmable electromagnet. The magnetic sector accordingly is preferably programmable to vary the mass range which it selects. The electromagnet of the magnetic sector preferably can be controlled or programmed by a variable power supply, which preferably is under electronic control, such as computer control. In this way the magnetic sector can act as a high pass or band pass (preferably high pass) mass filter to eliminate clusters and atoms below a certain size, i.e. for operation of the ion gun in the cluster mode setting, wherein the high pass lower mass limit may be varied. By using a programmable electromagnet in the high pass filter it is possible to also operate the gun in the more conventional mode of an atomic ion gun. It is not possible to operate in these dual modes in ion guns where high pass filtering is obtained using a permanent magnet for example.

The magnetic sector requires that the selected ions follow a bent path. The degree of bend is typically small, e.g. 1 to 5 degrees, preferably 1.5 to 4 degrees and is most preferably about 2 degrees. Larger angles could be used but would require a longer magnetic sector or a higher magnetic field. Using a typical beam aperture of 3 mm, lower angles than this would not allow neutrals to be effectively eliminated from the ion beam. Thus, preferably, the bent path has a bend between the entrance and the exit of the sector of e.g. 1.5 to 4 degrees. The use of a sector thereby also advantageously enables removal of neutral gas species from the beam so that they do not irradiate the surface. Otherwise, neutrals may cause etching outside the focused and scanned ion beam area. In the present invention, preferably the electromagnet magnet is able to select a minimum mass (i.e. lower mass limit) for example in the range of 50 to 400 argon atoms. Such a cluster size is smaller than has typically been used elsewhere and allows the ion source to be designed to operate at much lower ion energies than other ion sources while maintaining the same energy per atom required to etch surfaces of materials. The overall design of the ion gun can thus be much smaller and cheaper, e.g. with a simpler magnetic sector design because the source energies are lower. Typically, the ion gun of the present invention can operate at ion energies about 4 keV, which compares to typically 10 keV or 20 keV for other sources. The preferred mass selector in the present invention may therefore be cheap, simple and programmable. It may also provide a short flight path which is a significant benefit for producing an effective ion beam of gas clusters since clusters are known to have a short lifetime.

The variable mass selector preferably comprises an electrically floating ion optical device, which is preferably an electrically floating flight tube. In operation a voltage is applied to the variable energy ion optical device so that in conjunction with the magnetic field of the mass selector a more flexible tuning of the mass selection is made possible and thereby operation in the widely different cluster and atomic modes can be achieved. The voltage on the floating ion optical device is selected and applied independently of the source energy or voltage. The magnetic field of the mass selector in this way does not have to depend solely on the source energy of the ions but rather the energy of the ions within the magnetic field of the mass selector can be adjusted using the floating ion optical device to enable a simpler magnetic mass selector design possible with lower magnetic fields for example. The floating ion optical device thus alleviates the need for either a higher magnetic field or a longer flight path in the magnetic sector. The floating ion optical device preferably is located at least partially within the magnetic field of the mass selector, i.e. preferably at least partially within the mass selector. More preferably, the floating ion optical device is located within the mass selector and extends substantially the length of the magnetic mass selector. In this way the device can control the ion energy along substantially the length of the ion flight path within the mass selector.

An electrically floating flight tube is thus preferably used in the ion gun whereby the ions pass through the floating flight tube. The electrically floating flight tube preferably is located at least partially within the magnetic field of the mass selector (preferably the magnetic sector), i.e. preferably at least partially within the mass selector, so that the ions pass through the floating flight tube as they pass through the magnetic field (sector). More preferably, the floating flight tube is located within the magnetic sector and extends substantially the length of the magnetic sector. The floating flight tube preferably extends substantially the length of the flight path of the ions inside the magnetic mass selector, e.g. where the floating flight tube extends substantially the length of the magnetic sector. In operation a voltage is applied to the floating flight tube so that in conjunction with the magnetic field of the mass selector a more flexible tuning of the mass selection is made possible and thereby operation in the widely different cluster and atomic modes can be achieved. The voltage of the floating flight tube is selected and applied independently of the source energy or voltage.

The use of the floating flight tube is described below in more detail in the context of the preferred embodiment using the magnetic sector. The voltage is applied to the floating flight tube to change the energy of the ions as they pass through the magnetic sector. The selection of ions by the magnetic sector, which depends on the degree of deflection of the ions by the magnetic field of the magnetic sector, depends on the ion energy and the magnetic field strength. The source energy of the ions produced may otherwise dictate the range of magnetic fields required but the floating flight tube can change the energy of the ions whilst in the magnetic field to enable a simple magnet to be used with a relatively small range of magnetic field strength variation for example. For instance, in the cluster mode, the voltage applied to the floating flight tube may retard (i.e. reduce the energy of) the ions as they pass through the magnetic sector. This gives additional control, in combination with the programmed magnetic field, over the range of masses selected. In atomic mode, the voltage applied to the floating flight tube may accelerate the ions as they pass through the magnetic sector and so minimize space charge effects at low currents. For example, for a given ion source energy, using the floating flight tube to adjust the ion energy in its vicinity, the mass selection using the magnetic sector may be varied over a wider range of masses with good control compared to using only the magnetic sector.

In a known ion gun the ions are formed with a particular source energy and the beam will stay at this energy while the beam is mass filtered. Varying the energy of the ions is known to be beneficial in order to optimise the sample etch process. However, this is not fully realisable due to a lack of flexibility in the design of the subsequent mass filtering. For example, if a high ion energy is required then a large magnetic field will then necessarily be required which may be difficult to achieve in practice, especially in a cost-effective way. In practice, it is difficult to generate magnetic fields much above 0.2 Tesla without using expensive magnetic alloys. Conversely, if a low ion energy is required then a small magnetic field will then necessarily be required leading to a poor mass selection performance. It is also complex and costly to finely or rapidly control magnetic field strengths. Using a floating flight tube in the present invention allows the ion gun to independently vary the source energy of the ions and the energy of the ions at the mass selector to optimise both ion energy and mass selection. The use of the floating flight tube thereby enables a simple high pass magnetic sector to be used with, for example, different ion energies whilst maintaining independent mass selection and mass selection over a range of masses to enable the ion gun to select either clusters or atomic ions.

For example, the ability to select either cluster or atomic ions would conventionally require a large change in the magnetic field strength, which is not readily possible to achieve with a small and cheap magnetic field. However, the present invention enables a simpler, smaller magnetic field magnetic sector to be used, which has for example a lower magnetic strength which is suitable for mass selection of a beam of atomic ions but which, because the floating ion optical device can be used to retard the ions (reduce their energy), can enable the same magnetic sector to be used to mass select a beam of cluster ions. The magnetic field required to deflect a given mass of ion through a given angle will scale as the square root of the energy of the ion. Thus in the present invention, for example, the ions may be retarded by the floating flight tube from a source energy of 4 keV to an energy of 1 keV in the flight tube, so that only half the magnetic field strength is needed that would have been required without the floating flight tube. This enables, for example, in practice the use of magnetic field strengths less than 0.2 Tesla in the mass selector. This is a considerable benefit in practice since it is difficult to generate fields above 0.2 Tesla without using expensive magnetic alloys. This benefit is becomes even greater for larger clusters that might be required for processing surfaces of very delicate materials.

Whilst a magnetic sector has been described herein as the preferred embodiment for the mass selector, it will be apparent that variations of the invention may be performed using other types of variable mass selector, especially mass selectors operable as a high pass or band pass mass filter. The following are example of alternative mass selectors which could be substituted for the preferred magnetic sector but have various drawbacks compared to the magnetic sector. A Wein filter may be used but requires additional electrostatic electrodes which are difficult to engineer in the available space, as well as accompanying additional electronics. A focussing magnetic sector, e.g. as used in mass spectrometers, may be used and gives excellent mass resolution and acts as a band pass mass filter. However, these are typically too large and complicated for the present application where a high mass pass filter is adequate. An RF quadrupole filter may be used but is relatively expensive to manufacture and to build due to r.f. control electronics. Furthermore they do not work well for high masses, e.g. above 500 amu. A time of flight mass selector is used in cluster sources for SIMS, where short pulses are required but it is not suitable for a continuous beam. The use of a high pass magnetic sector to form the preferred mass selector is cheap, simple and programmable.

The ion gun thus uses a variable mass selector which can vary the mass selected by the mass selector independently of the energy of the ions input to the mass selector, the variable mass selector preferably comprising a variable energy ion optical device, which is preferably a floating flight tube. Thus, the ion gun comprises a variable energy ion optical design allowing the cluster energy to be varied, independently of the cluster size, and so to select the energy of the fragmented ions (energy per atom) to be the most appropriate energy for the sample to be etched.

The ion gun preferably further comprises conventional ion optical components to scan the ion beam across a surface (e.g. pairs of X-Y scanning electrodes) and/or to focus the ion beam to bring the beam to a focus at or near the surface to be processed and/or to achieve the desired ion beam spot size at the surface (e.g. an objective lens).

DETAILED DESCRIPTION

The present invention will now be described in more detail by way of non-limiting embodiments and examples with reference to the accompanying Figures.

LIST OF FIGURES

Figure 1:
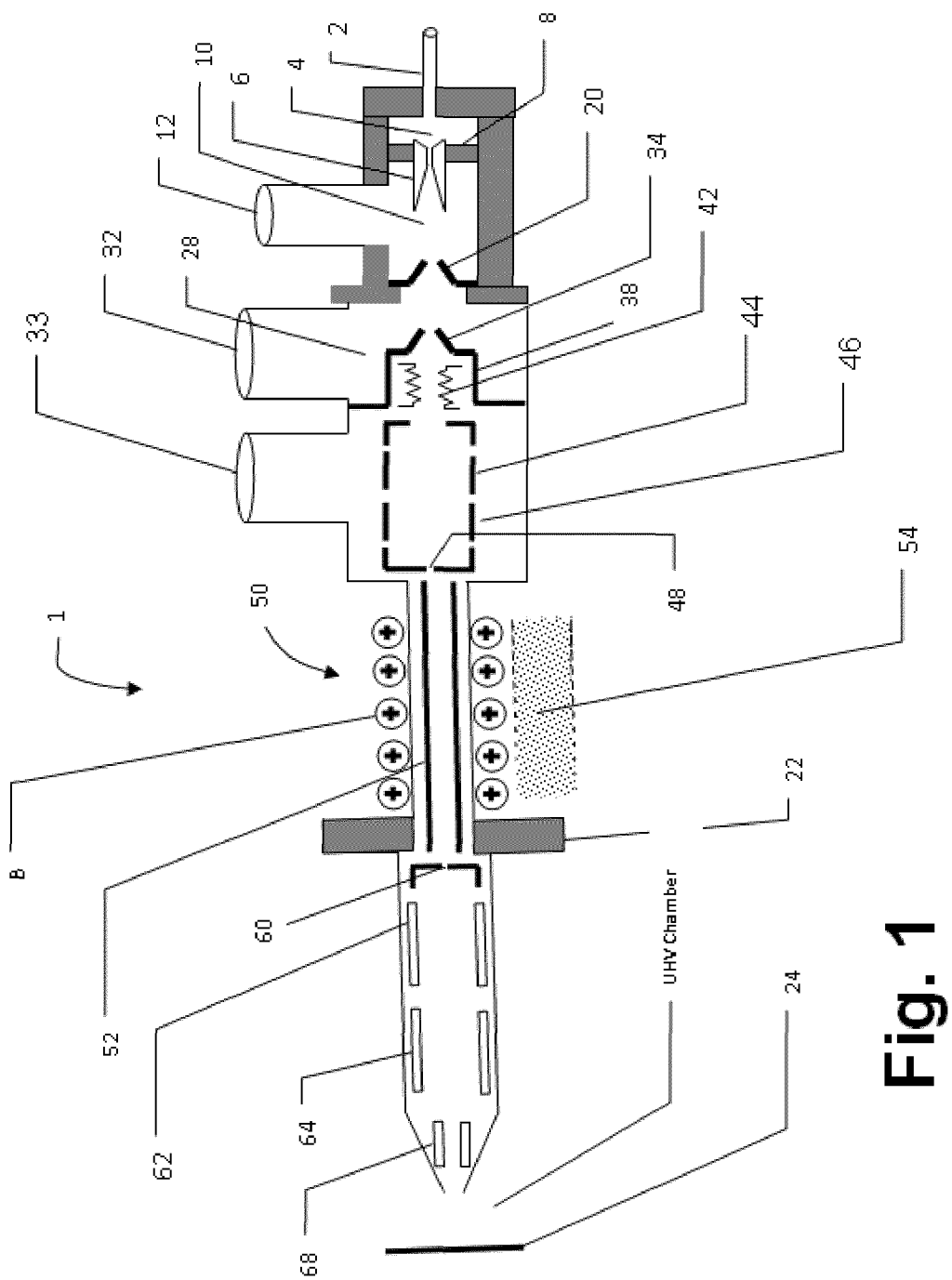
FIG. 1 shows a schematic view from the side of an ion gun according to the present invention.
Figure 2:
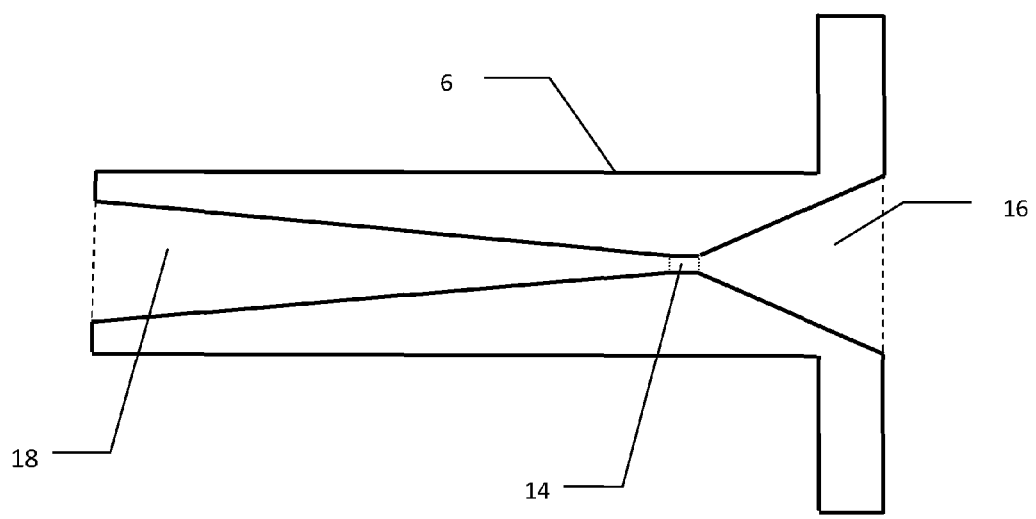
FIG. 2 shows a schematic view from the side of a gas expansion nozzle of an ion gun according to the present invention.

Referring to FIG. 1, there is shown a schematic view from the side of an ion gun 1 according to the present invention. The ion gun in use is fixed to a port of a UHV analysis chamber (not shown) by means of flange 22, which in this case is a UHV conflat flange. In the UHV analysis chamber is situated a sample 24 in line of sight of the ion gun 1. The pressure in the UHV Chamber is less than $10^{-6}$ mbar and is typically $2\times10^{-7}$ mbar for XPS analysis for example. The UHV chamber is configured with analysis tools to enable XPS and optionally AES and/or other surface analysis to be performed on the sample 24. The ion gun according to the invention is fully compatible with use on a high or ultra-high vacuum environment. In preferred embodiments for such use, the ion gun is bakeable and may be baked-out together with the vacuum chamber before use.

Figure 3:
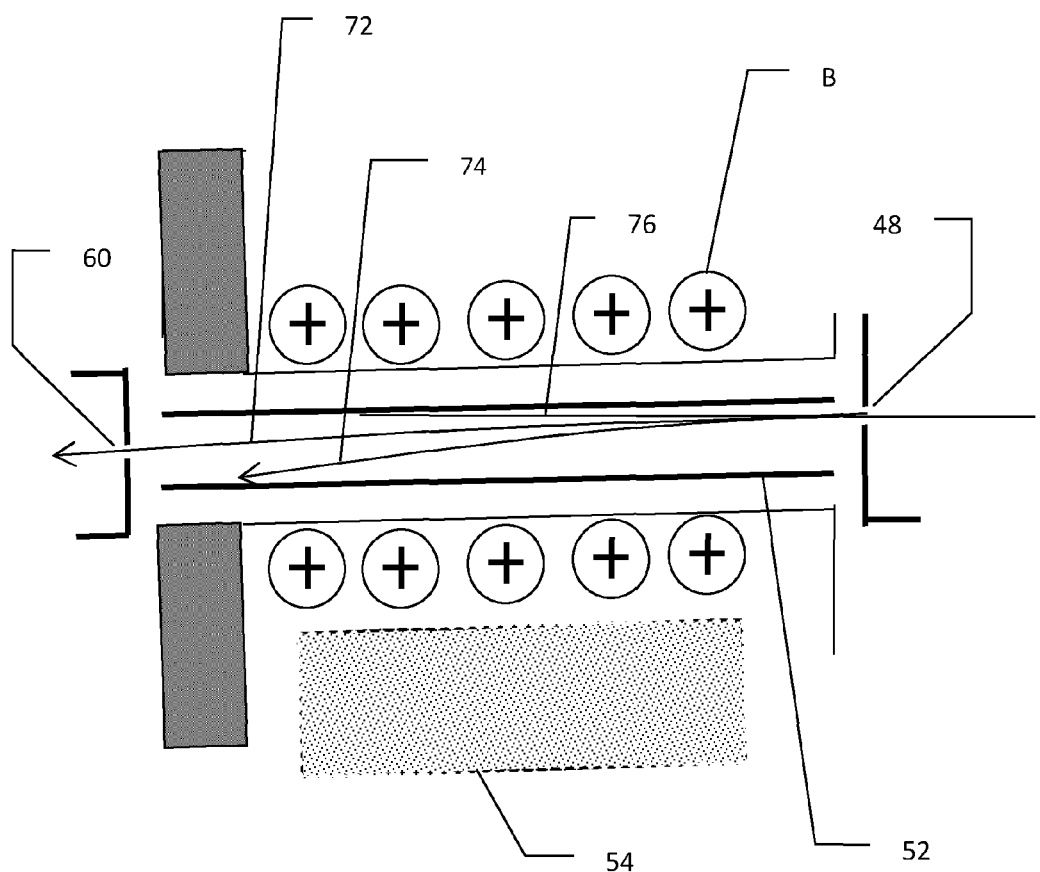
FIG. 3 shows an expanded schematic view from the side of the embodiment shown in FIG. 1 in the region of the ion gun mass selector.

The ion gun 1 is generally in the form of a column having a series of components arranged as now described. The ion gun has at its upstream end a high pressure source chamber 4 and argon gas is introduced, e.g. from a pressurised gas cylinder (not shown), into the source chamber 4 through a gas inlet in the form of gas inlet pipe 2. Argon is the preferred gas for use with the ion gun but other gases may be used and mixtures of gases may also be used. The pressure of argon in the inlet and source chamber 4 is about 4 bar. In a front wall 8 of the source chamber 4 is a gas expansion nozzle 6 shaped and dimensioned for supersonic expansion of the argon from the source chamber 4 through the nozzle. The nozzle is a microfabricated metal nozzle and its shape is shown in more detail in FIG. 3. The nozzle 6 as shown in FIG. 3 has a conical shaped inlet 16 at its end in the source chamber 4 and a conical shaped outlet 18 terminating in a pumped vacuum chamber 10, the outlet 18 having a 5 degree half angle taper. The inlet and outlet are connected by an aperture 14 of 100 microns diameter or less. In alternative embodiments, other shapes of nozzle may be used, such as a laval nozzle or a sonic nozzle, the latter consisting of an open aperture without any shaped section to contain the gas flow.

The argon is expanded through the nozzle 6 into the pumped vacuum chamber 10 which is continuously pumped by a vacuum pump (not shown) to a rough vacuum of about 0.5 mbar or less, the chamber 10 being pumped through pumping aperture 12. As the argon expands through the nozzle 6, the expanding gas cools rapidly and clusters of argon atoms are formed. The gas forms a beam as it is accelerated to supersonic speed by its expansion, creating a mach disk at a distance from the nozzle. Clusters and non-clustered individual atoms are extracted from the centre of the expanding beam, just prior to the Mach disk, using a skimmer 20 of a conical profile carefully designed to minimise disruption of the supersonic beam.

In order to maintain a high vacuum in the analysis chamber, a second stage of differential pumping is employed in the form of pumped vacuum chamber 28, which is continuously pumped by a vacuum pump (not shown) to a medium vacuum of less than $10^{-3}$ mbar, typically $4 \times 10^{-4}$ mbar, the chamber 28 being pumped through pumping aperture 32. After the second pumping stage 28, the beam passes through a small aperture in a collimator cone 34 into an ionisation chamber 38. The ionisation chamber 38, as well as the downstream ion optics and mass selection stage, is continuously pumped to high vacuum through pumping aperture 33 wherein the pressure is less than $10^{-4}$ mbar and is typically $10^{-5}$ mbar.

In the ionisation chamber 38 thermally generated electrons from heated filaments 42 are injected into the ionisation Chamber by biasing the filaments 42 at a negative potential, in this case 100 volts, with respect to the chamber. A fraction of both the clusters and the individual argon atoms in the ionisation chamber thereby are ionised by electron impact to produce positively charged ions. A positive voltage of 4 keV is applied to the ionisation chamber in which the ions are created and this positive voltage determines the final energy of the ions when they reach the surface of the sample 24. This voltage is therefore termed the source voltage. The surface 24 which is irradiated by the ion beam is held at ground potential in this case. In the examples below 4 keV is used as the positive ion source voltage but a voltage in the range 2 to 20 keV could be used, although voltages of 6 keV or less are preferred. Ions of argon clusters of wide range of sizes as well as ions of individual argon atoms are present in the beam and are extracted from the ionisation chamber 38 further downstream in the ion gun column by an extraction electrode or lens 44 to which is applied a potential slightly more negative than the ionisation chamber 38. Once extracted the ions are focussed by a condenser lens 46 into a beam aperture 48 of 3 mm diameter which defines the effective size of the ion beam. In operation, de-focussing using the condenser lens can allow the ion beam current to be reduced if required.

The beam of ions then enters a mass selector indicated generally at 50. The mass selector comprises an electrically floating flight tube 52 situated within the magnetic field B of a magnetic sector comprising a soft iron magnet mounted outside of the vacuum system of the ion gun (not shown). The magnetic field B is aligned transverse to the direction of flight of the ion beam through the flight tube 52. In FIG. 1 the magnetic field B is directed into the paper as indicted by the +symbols. The magnetic field B is programmable by means of an electromagnet 54 mounted outside the vacuum system which produces the transverse magnetic field. The magnetic sector is programmed using the electromagnet to deflect ions of the chosen mass so as to select at a selection aperture 60 a beam substantially comprising argon clusters of a selected size (mass) or substantially comprising atomic argon ions as described in more detail below.

In prior art designs wherein a beam aperture and flight tube are at earth potential, the energy of the ions passing through the flight tube will be at the full source energy defined by the source voltage. Any mass selection by magnetic fields that is performed in such an ion optical design must be designed to operate at this energy. In contrast, in the design of the invention the flight tube 52 can be floated to a voltage which is independent of the source voltage. In the embodiment shown, the beam defining aperture 48 and all sections of the flight tube 52 can be floated to a voltage which is independent of the source voltage. Typically, for selection of a beam of clusters, e.g. where a "softer" polymer material is to be etched, it is chosen to float the flight tube 52 at a voltage which is 1 kV less than the source voltage in order to generate a beam with an energy of 1 keV within the flight tube (e.g. using a source voltage of 4 keV and a flight tube voltage of 3 keV). In this configuration, the cluster ions pass through the flight tube 52 at a lower energy than that of the source energy making the design of the mass selector and its optics much simpler. In particular, by lowering the energy of the clusters a lower strength magnetic field may be used to achieve selection of clusters of the required mass. Alternatively, if low source energy is required, then the floating flight tube 52 can be used to accelerate the ions for mass selection. The use of the flight tube to adjust the ion energy as appropriate and independently of the source energy allows improved flexibility in the design of the mass selector. By programming the electromagnet 54 with a lower current (and thus lower magnetic field) atomic argon ions can be selected to form the beam through the selection aperture 60 in order to enable etching of "harder" materials. Overall the design of the present invention enables a lower strength magnetic field to be used for the selection of either clusters or atomic ions because of the additional use of the floating flight tube to adjust the energy of the ions within the mass selector, especially for example to reduce the energy of the ions when selecting a beam of clusters. The prior art designs would instead require impractical and costly wide range magnetic field scanning to achieve a similar effect. The prior art mass selector designs would be impractical because to achieve the required magnetic field they would be too big and heavy to be mounted from a port on a typical XPS analysis chamber. Generating higher magnetic fields may also require the use of more expensive magnetic alloys which may be costly. In contrast, the mass selector of the present invention may be implemented using only a soft iron magnet.

Referring to FIG. 3 to show the mass selection in more detail, the flight tube 52 forms part of the mass selector, and the electromagnet 54 of the magnetic sector (not shown) mounted outside the vacuum system produces a transverse magnetic field B. In cluster mode, the electromagnet is programmed to deflect a beam of cluster ions 72 of the chosen mass (typically with a mass above a lower mass limit of 200-2000 atoms) through an angle of 2 degrees to exit though the selection aperture 60. Ions of lower mass 74 are deflected through a larger angle and do not pass through the selection aperture 60. Ions of a higher mass 76 are deflected through a smaller angle and, if sufficiently massive, will not pass through the aperture 60. Similarly, the incorporation of the 2 degree deflection into the design of the ion gun column ensures that neutral clusters and atoms (e.g. non-ionised species or species formed by fragmentation of larger clusters) will not pass through the aperture 60 as they are not deflected by the magnetic field. Without the removal of neutral species in this way, such species, if of low enough mass, could cause significant damage to the sample. Neutral species of high mass which may not cause sample damage may still lead to non-uniform etching of the sample since they cannot be scanned by the deflection electrodes. This important benefit is not possible using a permanent magnet as the mass filter. The mass selector described in the shown embodiments may thus provide a band pass filter. However, if suitably designed, the inherent asymmetry in the properties of this sort of filter allows this magnetic sector to effectively act as a high pass filter. A high pass filter is preferable to a simple narrow band pass filter in this application, since it generates a higher beam current.

After passing through the selection aperture 60, the mass selected ions pass through pairs of scanning deflectors or deflection electrodes 62, 64 for positioning the beam and/or performing a rastering or scanning function of the beam at the sample surface and finally pass through an objective lens 68 to focus the beam at the sample 24. After passing the objective lens, the energy of the beam returns to its original source voltage.

In one mode of operation, the deflectors 62, 64 and focussing objective lens 68 are used together to focus and scan the beam in a raster pattern over the surface of sample 24 to ensure uniform etching over a crater which is larger than the beam size. For depth profiling this technique is preferable to using a large area unfocused beam, although such an unfocused beam may be suitable in simple applications such as sample cleaning.

Figure 4:
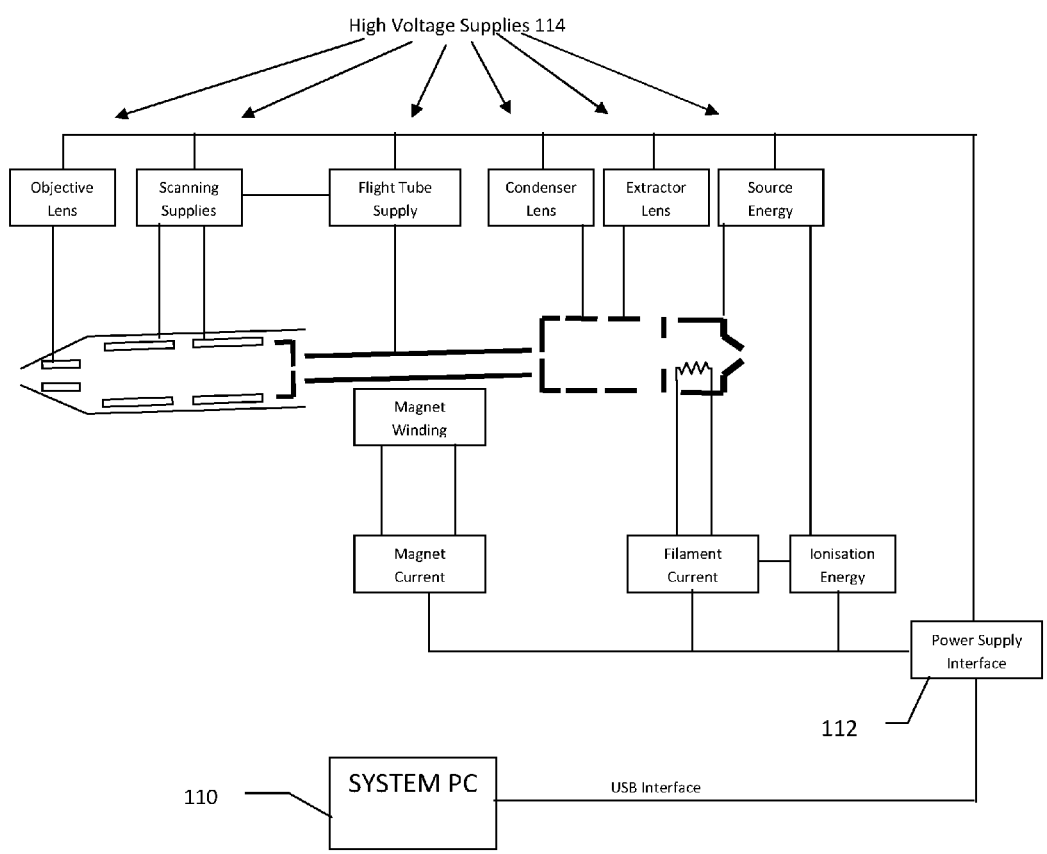
FIG. 4 shows another schematic view from the side of an ion gun according to the present invention with schematic power connections and control shown.

Referring to FIG. 4 there is shown components of the ion gun of FIG. 1 with schematic power connections. A system computer (System PC) 110 controls various high voltage power supplies 114 for the components via a Power Supply Interface 112 to which the computer is connected via a USB interface. The Power Supply Interface 112 also controls the filament current and magnet current to the magnetic winding of the electromagnet.

Typical operating conditions that can be used for each mode of operation for the ion gun described with reference to FIGS. 1 to 4 are as follows.

Argon Cluster Beam Mode:

| Gas inlet pressure | 3.5 bar |
| --- | --- |
| Source Energy Voltage | 4000 V |
| Extractor Lens Voltage | 3600 V |
| Condenser Lens Voltage | 3500 V |
| Floating Flight Tube Voltage | 2000 V |
| Objective Lens Voltage | 2300 V |
| Ionisation Energy Voltage | −120 V |
| Magnetic Field in Sector | 0.13 Tesla |

Atomic Argon Beam Mode:

| Gas inlet pressure | 0.6 bar |
| --- | --- |
| Source Energy Voltage | 4000 V |
| Extractor Lens Voltage | 3000 V |
| Condenser Lens Voltage | 3700 V |
| Floating Flight Tube Voltage | 0 V |
| Objective Lens Voltage | 2300 V |
| Ionisation Energy Voltage | −70 V |
| Magnetic Field in Sector | 0.01 Tesla |

The ion gun may be used to clean a surface prior to a surface analysis or it may be used to etch a sample to a desired depth. In particular, the ion gun may be suitable for depth profiling XPS measurements, wherein XPS analysis is performed on a region of the sample surface whilst concurrently etching the surface in that region using the ion gun of the present invention to increase the depth of the XPS analysis and thereby to reveal the composition of the sample in depth direction. The present ion gun enables such depth profiling to be performed on soft or hard samples by the appropriate selection of either a cluster ion beam or atomic ion beam. For soft materials, for example polymer materials, the energy per atom required to etch the surface without significant damage thereto is typically from a few eV to several tens of eV while for harder materials it may be much higher and an atomic ion beam may be selected. The ability to tune the ion energy to the material to be etched allows the user to optimize the profile for the chemical information to be obtained.

The following examples illustrate various operations of the present invention.

EXAMPLE 1

Figure 5A:
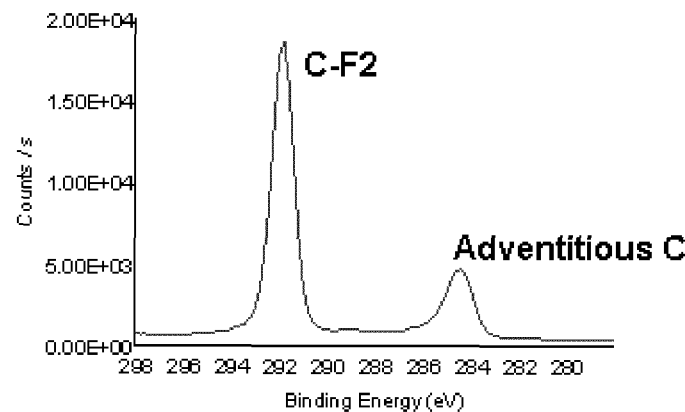
FIG. 5 shows the results of cleaning a contaminated PTFE surface with a conventional argon ion beam and a cluster ion beam using an ion gun according to the present invention.
Figure 5B:
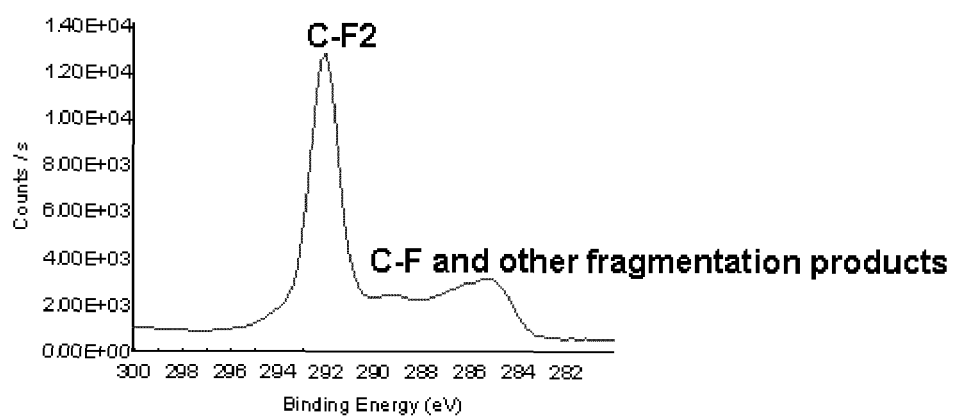
Figure 5C:
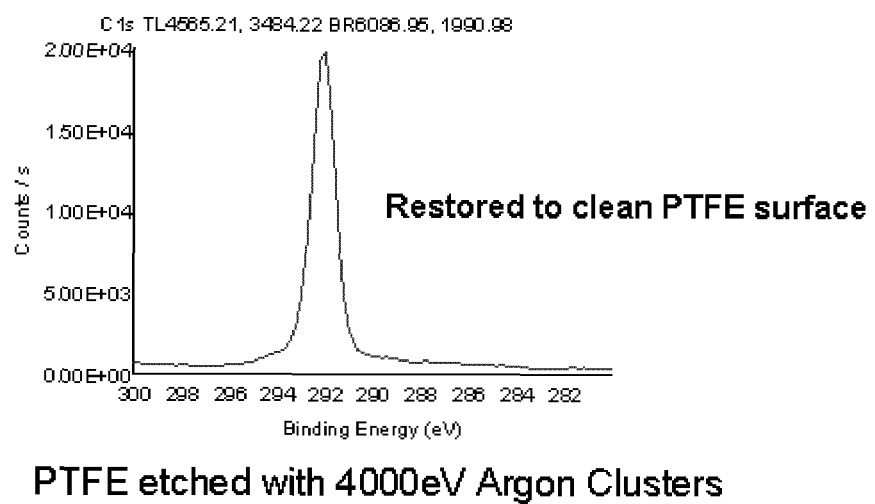

To illustrate its effectiveness, data was obtained from using the ion gun according to the invention to etch a PTFE polymer sample "as received" which had an XPS spectrum showing the C—F2 fluorocarbon bonds of the sample together with a layer of "adventitious carbon" contamination on the surface as shown in FIG. 5A. Attempts to remove this surface contamination with a conventional argon ion beam (200 eV) caused chemical damage to the sample as shown in FIG. 5B. However, when etching the surface with the ion gun according to the invention in cluster mode (source energy 4 keV; minimum cluster size=200 atoms; max energy per atom=20 eV) etching with a cluster beam resulted in a clean undamaged spectrum as shown in FIG. 5C.

EXAMPLE 2

Figure 6A:
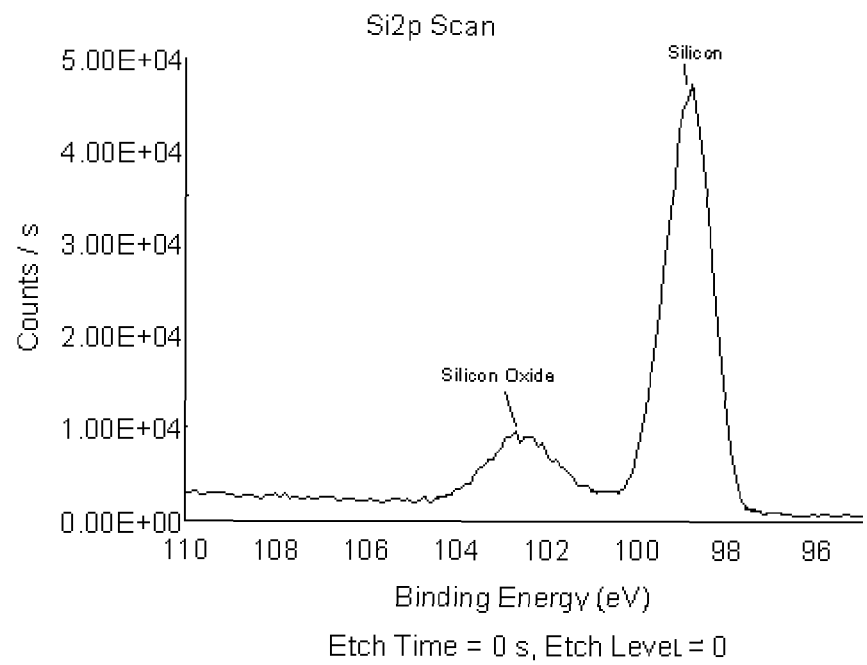
FIG. 6 shows the results of etching and depth profiling on an oxidised surface of a silicon wafer with an atomic argon ion beam using an ion gun according to the present invention.
Figure 6B:
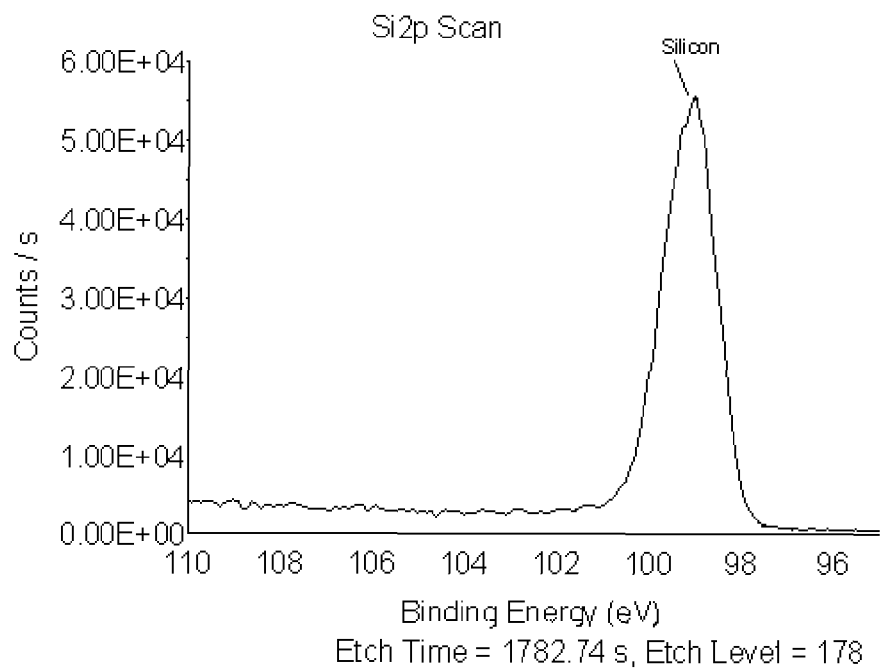
Figure 6C:
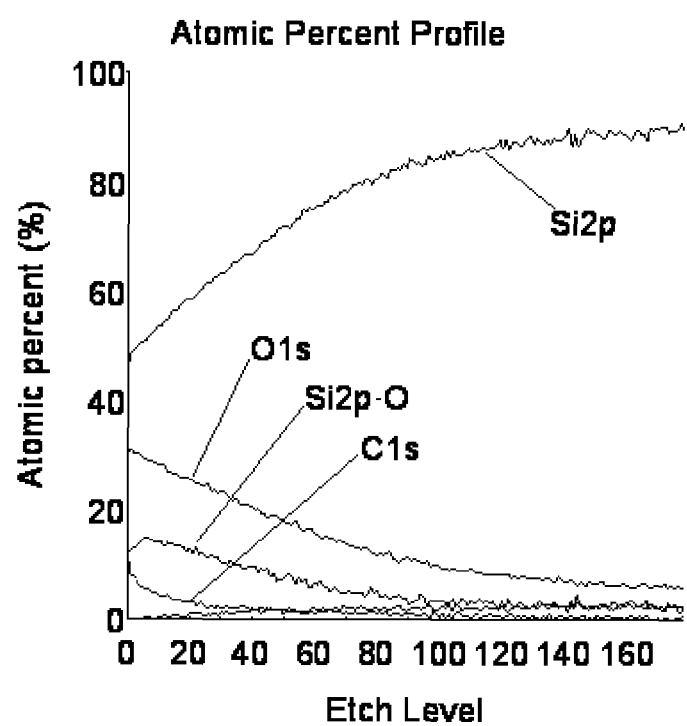

Referring to FIG. 6 there are shown XPS results on a silicon wafer having initially a thin film of Silicon Oxide thereon. FIG. 6A shows the Si 2p XPS scan from the wafer before etching, i.e. at etch time=0 s and etch level=0. The etch level is an arbitrary unit related to the depth of etching, which can be translated into a true "depth" once the etch rate is determined by using a calibrated sample. In the scan of un-etched wafer separate peaks can be seen for the pure un-oxidised silicon (large peak) and the silicon oxide (small peak). The ion gun was then set to its argon atomic ion mode and argon ions as ionised single argon atoms at a source energy of 4 keV irradiated the surface of the wafer to depth profile through the silicon oxide surface film. As shown in FIG. 6B at an etch level of 178, the XPS spectrum of the wafer after the depth profiling was completed shows only the un-oxidised silicon. The XPS depth profile in FIG. 6C shows the gradual removal of the adventitious carbon and the surface oxide. Depth profiling through such a relatively hard material as silicon and silicon oxide with merely a cluster ion beam would be very slow indeed.

EXAMPLE 3

Figure 7A:
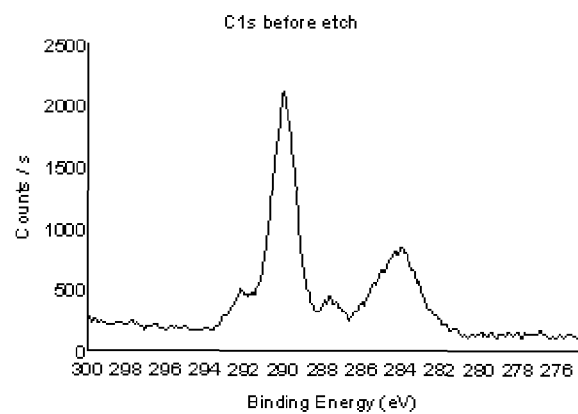
FIG. 7 shows the results of etching and depth profiling on a PTFE surface.
Figure 7B:
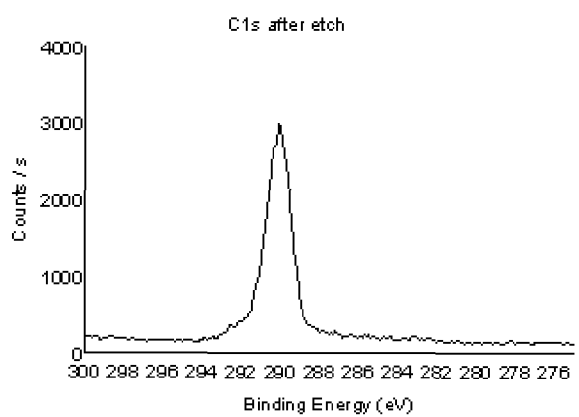
Figure 7C:
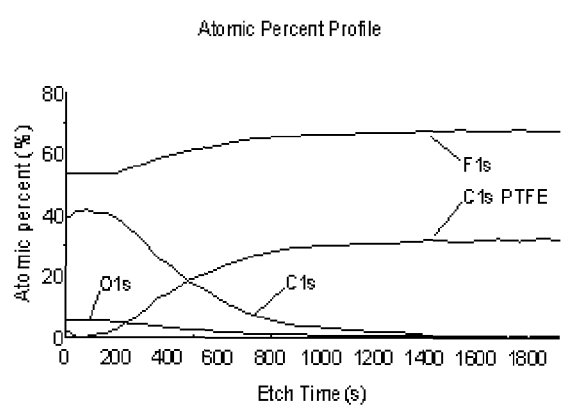

Referring to FIG. 7 there are shown XPS results for depth profiling on another very delicate sample, a fluoropolymer film on a PTFE substrate using the ion gun in its cluster mode with the same settings as Example 1. It is well known that PTFE is easily damaged by ion beam bombardment. As shown in FIG. 7A, before etching, and during the depth profile, a well resolved fluoropolymer spectrum is observed showing the details of the sample chemistry. After etching through the film, a spectrum as shown in FIG. 7B of the undamaged PTFE substrate is observed showing only the C—F2 bonded carbon of PTFE, with no peaks corresponding to any broken C—F or C—C bonds. The depth profile shown in FIG. 7C shows the transition through an undamaged fluoropolymer film into an undamaged PTFE film.

As used herein, including in the claims, unless the context indicates otherwise, singular forms of the terms herein are to be construed as including the plural form and vice versa. For instance, unless the context indicates otherwise, a singular reference herein including in the claims, such as "a" or "an" means "one or more".

Throughout the description and claims of this specification, the words "comprise", "including", "having" and "contain" and variations of the words, for example "comprising"

and "comprises" etc, mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

The use of any and all examples, or exemplary language ("for instance", such as", for example" and like language) provided herein, is intended merely to better illustrate the invention and does not indicate a limitation on the scope of the invention unless otherwise claimed. No language in the specification should be construed as indicating any non-claimed element as essential to the practice of the invention.

The invention claimed is:

1. A dual-mode ion gun comprising:
   a computer configured to select a cluster mode or an atomic mode;
   a gas expansion nozzle in communication with a pressurized region configured to produce a beam that substantially comprises gas clusters and gas atoms in the cluster mode, and that substantially comprises gas atoms or gas clusters and gas atoms in the atomic mode;
   an ionisation chamber configured to ionise the beam; and
   a variable mass selector comprising a magnetic sector configured to cause the ionised beam to follow a bent path so as to pass through a selection aperture and remove neutral gas species from the ionised beam, wherein the cluster mode programs the magnetic sector to cause ionised the gas clusters but not the ionised gas atoms to follow the bent path and pass through the selection aperture so that the beam substantially comprises only the ionised gas clusters, and the atomic mode programs the magnetic sector to cause the ionised gas atoms but not the ionised gas clusters to follow the bent path and pass through the selection aperture so that the beam substantially comprises only the ionised gas atoms.

2. A dual-mode ion gun as claimed in claim 1 wherein the gas expansion nozzle comprises a microfabricated metal expansion nozzle.

3. A dual-mode ion gun as claimed in claim 1 wherein the gas expansion nozzle comprises an aperture not more than 100 microns in diameter.

4. A dual-mode ion gun as claimed in claim 1 wherein the variable mass selector comprises an electrically floating ion optical device for adjusting the energy of the ions within the magnetic variable mass selector.

5. A dual-mode ion gun as claimed in claim 4 wherein the electrically floating ion optical device comprises an electrically floating flight tube.

6. A dual-mode ion gun as claimed in claim 4 wherein the electrically floating ion optical device is located at least partially within the magnetic variable mass selector.

7. A dual-mode ion gun as claimed in claim 4 wherein the cluster mode is configured to retard the ionised gas atoms as they pass through the magnetic sector and the atomic mode is configured to accelerate the ionised gas atoms as they pass through the magnetic sector.

8. A dual-mode ion gun as claimed in claim 4 wherein the magnetic sector produces a magnetic field strength less than 0.2 Tesla.

9. A dual-mode ion gun as claimed in claim 1 wherein the ionised gas atoms and the ionised gas clusters are formed in the ionisation chamber at a source energy of 6 keV or less.

10. A dual-mode ion gun as claimed in claim 1 wherein a source energy of the ionised gas atoms and the ionised gas clusters can be selected independently of the selection of the size of the ionised gas atoms and the ionised gas clusters by the variable mass selector.

11. A dual-mode ion gun as claimed in claim 1 wherein the ionised beam is extracted from the ionisation chamber by an extractor electrode and focused by a condenser lens before entry of the ionised beam to the variable mass selector.

12. A dual-mode ion gun as claimed in claim 1 wherein the variable mass selector is operable as a high pass mass selector.

13. A dual-mode ion gun as claimed in claim 1 wherein the magnetic sector comprises a programmable electromagnet to vary the mass range of the ionised gas atoms and the ionised gas clusters selected by the magnetic sector.

14. A dual-mode ion gun as claimed in claim 1 wherein the bent path has a bend between the entrance and the exit of the magnetic sector of between 1 and 5 degrees.

15. A dual-mode ion gun as claimed in claim 1 wherein the magnetic sector comprises a length that is less than or equal to about half of an ion path length from an inlet of the nozzle to a sample.

16. A dual-mode ion gun as claimed in claim 1 wherein the magnetic sector comprises a length that is less than or equal to about a third of an ion path length from an inlet of the nozzle to a sample.

17. A dual-mode ion gun as claimed in claim 16 wherein the ion path length comprises 600 mm.

18. A dual-mode ion gun as claimed in claim 1 wherein a power supply interface controls a magnet current to the magnetic sector according to a program determined by a mode selection of the computer.

* * * * *